(12) United States Patent
Sun et al.

(10) Patent No.: US 9,385,236 B1
(45) Date of Patent: Jul. 5, 2016

(54) FIN SHAPED SEMICONDUCTOR DEVICE STRUCTURES HAVING TIPPED END SHAPE AND METHOD FOR FABRICATING THE SAME

(71) Applicant: UNITED MICROELECTRONICS CORP., Hsin-Chu (TW)

(72) Inventors: Chien-Ying Sun, Tainan (TW);
En-Chiuan Liou, Tainan (TW);
Ming-Shing Chen, Tainan (TW);
Yu-Cheng Tung, Kaohsiung (TW);
Chih-Wei Yang, Kaohsiung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/748,240

(22) Filed: Jun. 24, 2015

(30) Foreign Application Priority Data

May 26, 2015 (CN) .......................... 2015 1 0273696

(51) Int. Cl.
| | |
|---|---|
| *H01L 21/28* | (2006.01) |
| *H01L 29/66* | (2006.01) |
| *H01L 29/78* | (2006.01) |
| *H01L 29/06* | (2006.01) |
| *H01L 21/8234* | (2006.01) |
| *H01L 27/088* | (2006.01) |
| *G06F 17/50* | (2006.01) |

(52) U.S. Cl.
CPC ........ *H01L 29/7853* (2013.01); *G06F 17/5081* (2013.01); *H01L 21/823412* (2013.01); *H01L 21/823431* (2013.01); *H01L 21/823456* (2013.01); *H01L 21/823481* (2013.01); *H01L 27/0886* (2013.01); *H01L 29/0653* (2013.01); *H01L 29/66545* (2013.01); *H01L 29/7856* (2013.01)

(58) Field of Classification Search
CPC ................. H01L 21/823807; H01L 29/41791; H01L 29/785; H01L 29/41783; H01L 29/66795; H01L 21/823814; H01L 21/823821
USPC ............ 257/369, E21.632, E27.062; 438/222
See application file for complete search history.

(56) References Cited

U.S. PATENT DOCUMENTS

| | | | |
|---|---|---|---|
| 2013/0187237 A1 | 7/2013 | Yu et al. | |
| 2014/0117454 A1* | 5/2014 | Liu | H01L 29/785 257/368 |
| 2014/0159164 A1* | 6/2014 | Woo | H01L 21/3086 257/401 |
| 2015/0137203 A1* | 5/2015 | Tarabbia | H01L 21/823431 257/314 |

OTHER PUBLICATIONS

Tseng, Title of Invention: Semiconductor Device and Method for Fabricating the Same, U.S. Appl. No. 14/684,445, filed Apr. 13, 2015.

* cited by examiner

*Primary Examiner* — Thomas L Dickey
*Assistant Examiner* — Changhyun Yi
(74) *Attorney, Agent, or Firm* — Winston Hsu; Scott Margo (57) ABSTRACT

A semiconductor device and a method of forming the same, the semiconductor device includes a plurality of fin shaped structures and a dummy gate structure. The fin shaped structures are disposed in a substrate, where at least one of the fin shaped structures has a tipped end. The dummy gate structure is disposed on the substrate, and includes an extending portion covering the tipped end.

17 Claims, 6 Drawing Sheets

FIN SHAPED SEMICONDUCTOR DEVICE STRUCTURES HAVING TIPPED END SHAPE AND METHOD FOR FABRICATING THE SAME

BACKGROUND OF THE INVENTION

1. Field of the Invention

The invention relates to a semiconductor device and a method of forming the same, and more particularly, to a semiconductor device having a dummy gate structure and a method of forming the same.

2. Description of the Prior Art

As the size of the field effect transistors (FETs) is continuously shrunk, the development of the planar FETs faces more limitations in the fabricating process thereof. In order to improve such fabricating limitations, three-dimensional or non-planar transistor technologies, such as fin field effect transistor technology (FinFET) have been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, with the demands of miniaturization of semiconductor devices, the width of each fin-shaped structure narrows and the spacing between the fin shaped structures shrinks. Thus, forming fin shaped structures which can achieve the required demands under the restrictions of miniaturization, physical limitations and various processing parameters becomes an extreme challenge.

SUMMARY OF THE INVENTION

It is one of the primary objectives of the present invention to provide a semiconductor device and a method of forming the same, wherein the semiconductor device includes a dummy gate structure covering edges of fin shaped structures such that it is sufficient to obtain a more reliable semiconductor device.

To achieve the purpose described above, the present invention provides a semiconductor device including a plurality of fin shaped structures and a dummy gate structure. The fin shaped structures are disposed in a substrate, wherein at least one of the fin shaped structures has a tipped end. The dummy gate structure is disposed on the substrate and includes an extending portion covering the tipped end.

To achieve the purpose described above, the present invention provides a method of forming a semiconductor device including following steps. First of all, a plurality of shallow trench isolations is formed to surround a plurality of fin shaped structures in a substrate, wherein at least one of the fin shaped structures has a tipped end. Then, a dummy gate structure is formed on the substrate, wherein the dummy gate structure comprises an extending portion covering the tipped end.

According to the above, the semiconductor device and the forming method thereof in the present invention mainly forms the extending portion at least one side of the fin shaped structures, such that, the extending portion may extend to completely or efficiently cover two sides of the fin shaped structures, particular the deformed side of the fin shaped structures caused by optical proximity effects. Thus, the present invention is desired to form semiconductor devices with better reliability.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be described in detail. The preferred embodiments of the present invention are illustrated in the accompanying drawings with numbered elements.

Figure 1:
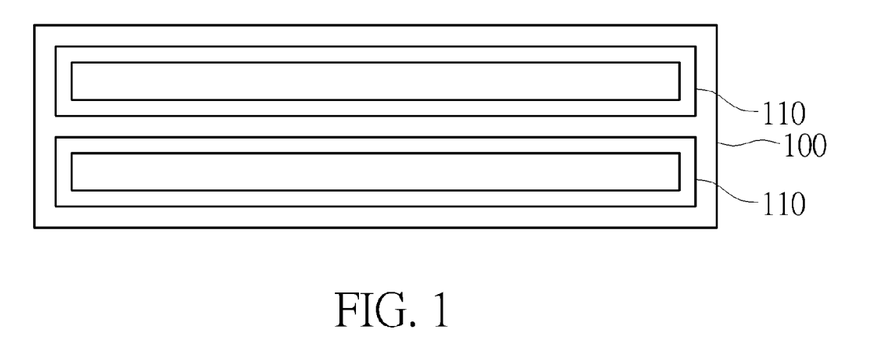
FIG. 1 to FIG. 6 are schematic diagrams illustrating a method of forming a semiconductor device according to a first embodiment of the present invention.

Please refer to FIG. 1 to FIG. 6, which are schematic diagrams illustrating a method of forming a semiconductor device according to the first embodiment of the present invention. First of all, as shown in FIG. 1, a substrate 100 is provided. The substrate 100 for example includes a semiconductor substrate, such as a silicon substrate, a silicon-containing substrate or a silicon-on-insulator (SOI) substrate. In one embodiment, a mask layer (not shown in the drawings) may be formed on the substrate 100, and which may include a monolayer or a multilayer structure, for example a composite mask structure consisted of a silicon oxide layer, a silicon nitride layer and a silicon oxide layer.

Next, at least one fin shaped structure 101 is formed in the substrate 100. In one embodiment of a bulk silicon, the fin shaped structures 101 may be formed preferably through a sidewall image transfer (STI) process. The process may include forming a plurality of patterned sacrificial layers (not shown in the drawings) on the substrate 100 by using a photolithography and an etching process, performing a depositing and an etching processes sequentially to form a spacer (not shown in the drawings) at sidewalls of each of the patterned sacrificial layers, and then removing the patterned sacrificial layers to keep the spacer in rectangular frames. After that, at least one etching process is performed by using the spacer as a mask, so that the patterns of the spacer may be directly or gradually transferred to the substrate 100 underneath, thereby forming a plurality of shallow trenches (not shown in the drawings) and simultaneously defining a plurality of fin shaped structures 110 in rectangular frames surrounding by the shallow trenches, as shown in FIG. 1. Furthermore, in the embodiment of having the mask layer, the patterns of the spacer may also be firstly transferred to the monolayer structure or the multilayer structure of the mask layer, and then, performing another etching process to transfer patterns of the patterned mask layer to the substrate 100 underneath.

After these, a fin cut process may be carried out, to remove unnecessary portion of the primary formed fin shaped structures, such as dummy fin and/or the two connection parts of each of the fin shaped structures 110 in rectangular frames.

Figure 2:
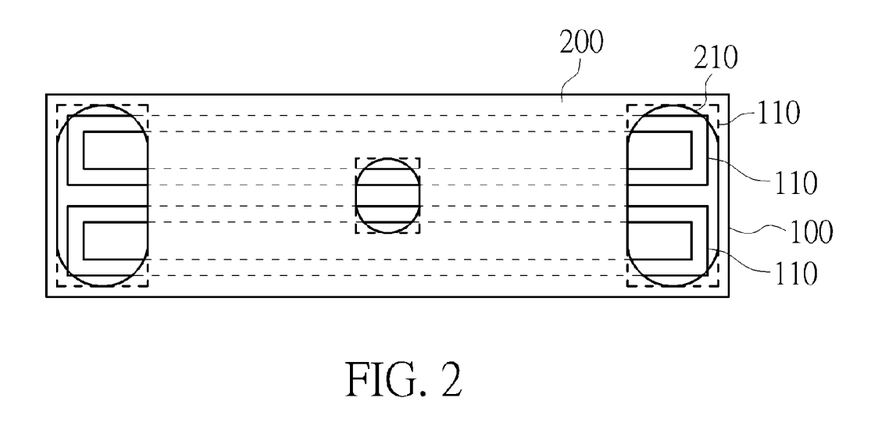

Precisely, the fin cut process is performed as shown in FIG. 2, by firstly forming a patterned mask, for example a photoresist layer 200 having at least one opening pattern 210, substantially covering the fin shaped structures 110 in rectangular frames, such that, a portion of the fin shaped structures 110 may be exposed from the opening pattern 210. It is worth mentioning that, while the photoresist layer 200 is formed, a lithography process is performed to define the opening pattern 210 of the photoresist layer 200, for example, using an optical exposure technique to transfer an etching pattern on a mask (not shown in the drawing) to the photoresist layer 200. Generally, the etching pattern used for defining the opening pattern usually includes a geometrical pattern formed by a combination of straight lines and right angles, such as a square pattern or a rectangular pattern. However, due to the critical dimensions of the opening pattern being limited by the resolution, optical proximity effects (OPCs) may easily occur in the photolithographic process during the formation of highly-integrated-design etching patterns, thereby causing overexposure or underexposure at corners of the opening pattern 210 of the photoresist layer 200, and resulting in a loss of resolution that may cause difference between the pattern transferred onto the photoresist layer 200 and the actual design patterns on the mask, or corner rounding effect. Thus, the opening pattern 210 slightly in circle or oval shape, as shown in FIG. 2, may be formed accordingly, wherein, a rectangular dotted frame 230 shown in FIG. 2 refers to actual design patterns on the mask.

Figure 3:
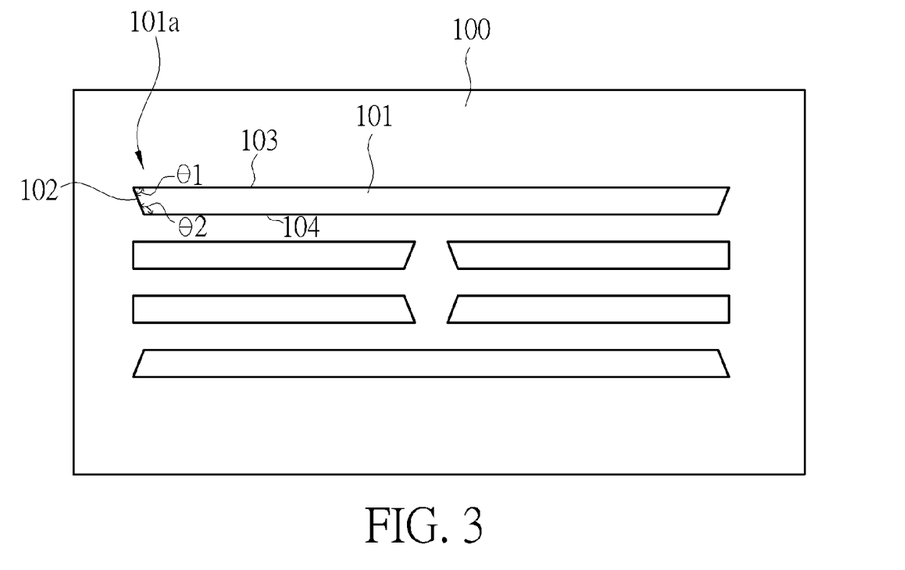

In this way, while an etching process is carried out subsequently by using the photoresist layer 200 as a mask, the fin shaped structures 110 in rectangular frames under the photoresist layer 200 may be etched and the etched end thereof may form a tipped end 101a as shown in FIG. 3, due to the effect of the deformed opening pattern 210. In other words, while the fin cut process is performed to form required layout of the fin shaped structures, such as the stripe arranged fin shaped structures 101 as shown in FIG. 3, at least one end of the fin shaped structures 101 may be affected by the opening pattern 210 of the photoresist layer 200 (due to optical proximity effect), thereby forming an inclined edge 102. In this way, the end of the fin shaped structures 101 may have a continuously shrunk width, thereby performing like the tipped end 101a. In the present embodiment, the inclined edge 102 may be a plane surface as shown in FIG. 3, so as to form an acute angle θ1 and an obtuse angle θ2 with two parallel edges 103, 104 of the fin shaped structures 101 respectively, but is not limited thereto. People skilled in the art shall easily realize that a cambered surface (not shown in the drawings) or an irregular surface (not shown in the drawings) may also be formed at the end of the fin shaped structures 101 of the present invention, due to the corner rounding effect of the opening pattern 210, rather than expected regular cut angle.

Next, a liner 105 covering the substrate 100 and surfaces of the fin shaped structures 101, and an insulating layer (not shown in the drawings) at least filling in the shallow trench may be formed sequentially, and a chemical mechanical polishing (CMP) process and an etching back process may be then performed, to forma shallow trench isolation (STI) 106 surrounding each of the fin shaped structures 101. Please note that, the detailed forming methods and the materials of the liners 105 and the shallow trench isolation 106 are well known in the art and will not be further detailed herein.

Figure 4:
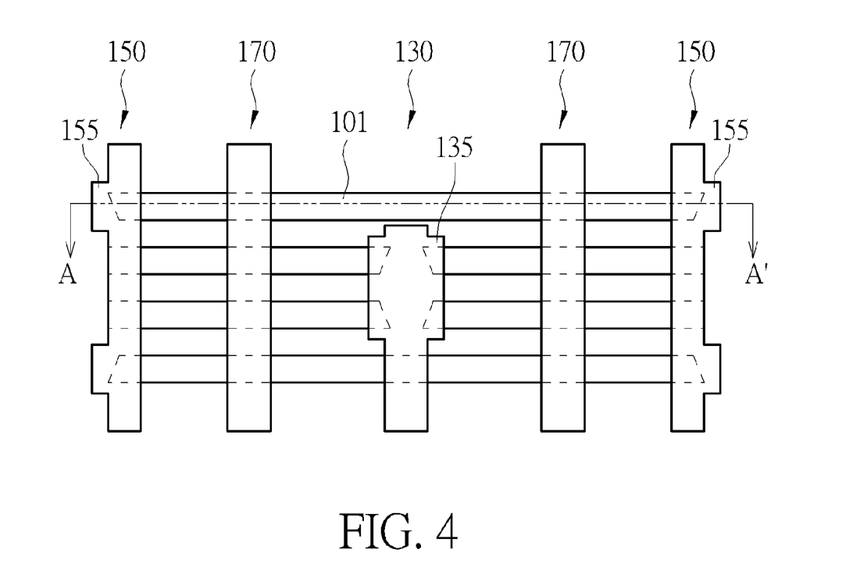
Figure 5:
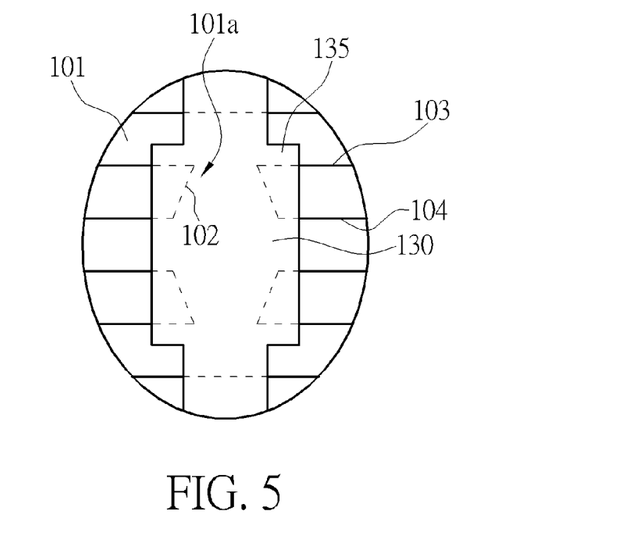
Figure 6:
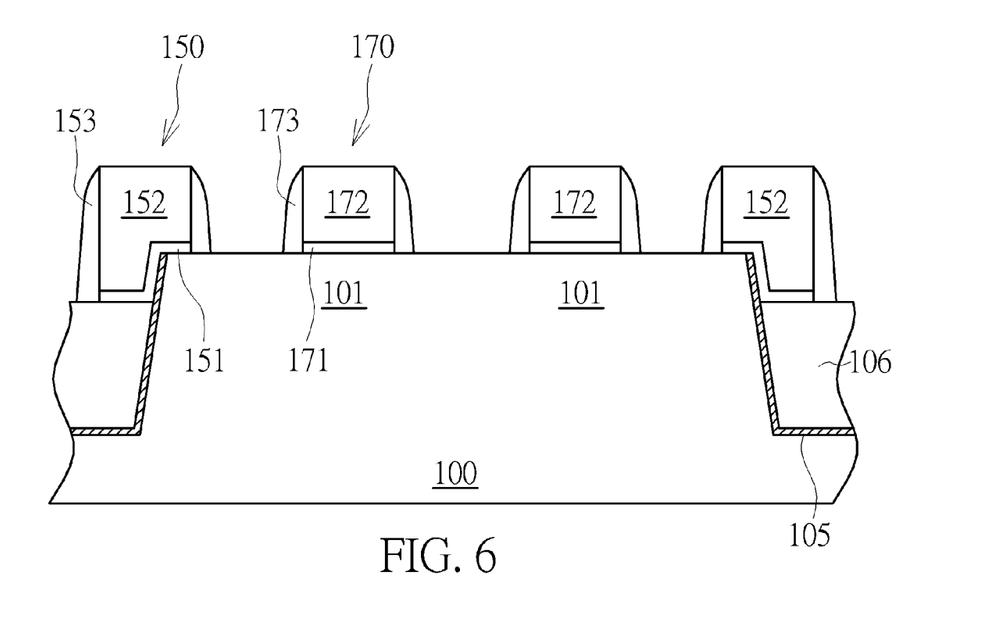

In the following, please refer to FIG. 4 to FIG. 6, wherein, FIG. 5 is a schematic enlargement view of a portion of FIG. 4; and FIG. 6 is a schematic cross-sectional view taken along the cross line A-A' of FIG. 4. Gate structures 130, 150, 170 are formed on the substrate 100, across the fin shaped structures 101. In the present embodiment, the formation of the gate structures 130, 150, 170 may include sequentially forming a gate dielectric material layer (not shown in the drawings), such as including an insulating material (e.g. silicon oxide), and a gate layer (not shown in the drawings) on the fin shaped structures 101, and patterning the gate layer and the gate dielectric material layer, to form the gate structures 130, 150, 170 on the fin shaped structures 101, as shown in FIG. 4 and FIG. 6. Precisely, each of the gate structures 150, 170 may include a gate dielectric layer 151, 171 and a gate electrode 152, 172, and a spacer 153, 173 surrounding the gate structures 150, 170 respectively may be then formed, wherein the spacer 153, 173 may include silicon nitride, silicon oxynitride or silicon carbonitride, but is not limited thereto.

It is worth mentioning that, since a portion of the gate structures 130, 150 right cross one end of the fin shaped structures 101, the gate structure 150 may have a portion thereof formed on the shallow trench isolation 106, as shown in FIG. 6. Namely, the portion of the gate structures 130, 150 directly covers a portion of the shallow trench isolation 106, so as to perform like a passing gate, thereby becoming a gate structure of a FinFET or only becoming a dummy gate structure without actual circuit. In the present embodiment, the formation of the passing gate or dummy gate structure may be integrated with a general gate forming process. Thus, the gate electrode of the dummy gate structure may include polysilicon, but the material thereof is not limited thereto and may be further modified according to the practical requirements or be formed through other processes.

Figure 7:
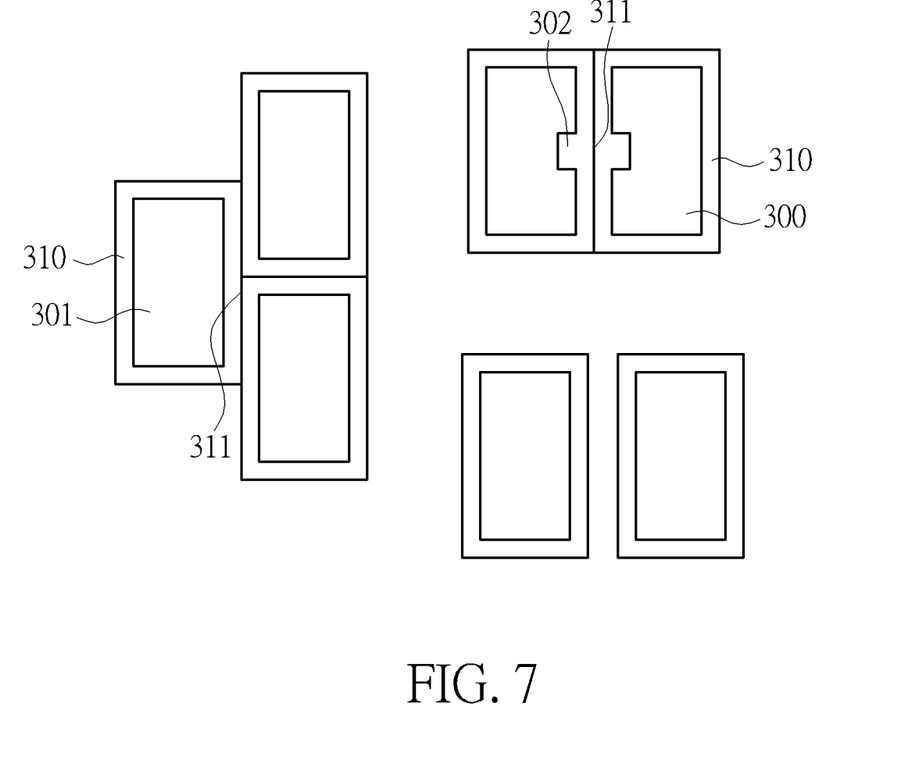
FIG. 7 is a schematic diagram illustrating forming a gate structure in a method of forming a semiconductor device according to one embodiment of the present invention.

Furthermore, it is also worth mentioning that, the gate structures 130, 150 preferably include an extending portion 135, 155 respectively at a portion thereof coving the tipped end 101a of the fin shaped structures 101. The extending portion 135, 155 extends from at least one side of the gate structures 130, 150 to extend along the extending direction of the fin shaped structures 101, so that, the tipped end 101a (caused by the deformed opening patterned 210 of the photoresist layer 200) may be completely covered, as shown in FIG. 4 and FIG. 5. In one embodiment, the extending portion 135, 155 preferably not only covers the tipped end 101a, but also further extends to cover the rest portion of the fin shaped structures 101, namely, to partially cover the two parallel edges 103, 104 of the fin shaped structures 101, as shown in FIG. 5. In this way, the present invention may be desired to prevent the tipped end 101a from being uncompleted or inefficiently covered by the dummy gate structures, and be the cause of a defect device. However, people skilled in the art shall easily realize that the forming method of the gate structures 130, 150, 170 is not limited to the aforementioned process, and may include other steps. For example, in another embodiment, a plurality of gate structures (not shown in the drawings) crossing the fin shaped structures 101 may also be formed through a sidewall image transferring process, which may include firstly forming patterned sacrificial layers 301 in various pitches as shown in the left of FIG. 7; or forming patterned sacrificial layers 300 having an inwardly shrunk notch as shown in the right of FIG. 7. In this way, spacer 310 formed subsequently on sidewalls of the patterned sacrificial layers 300, 301 may partially merge with each other, thereby forming a wider portion 311. Thus, the gate structures 130, 150 having the extending portion 135, 155 shown in FIG. 6 may be formed on the substrate 100 by using such spacer 310 as a mask in an etching process, but the present invention is not limited thereto.

Through the above mentioned steps, the semiconductor device according to the first embodiment of the present invention is obtained. Subsequently, a light-doped drain (LDD)

process, source/drain process, a selective epitaxial growing (SEG) process, a silicidation process, a contact etching stop layer (CESL) process or a replacement metal gate (RMG) process may be performed. Those processes are similar to a conventional forming process of a transistor and will not be further detail herein. Also, people in the art shall easily realize that the semiconductor device of the present invention is not limited to being formed through the aforementioned processes, and may also be formed through other forming methods.

The following description will detail the different embodiments of the semiconductor device and the forming method thereof of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 8:
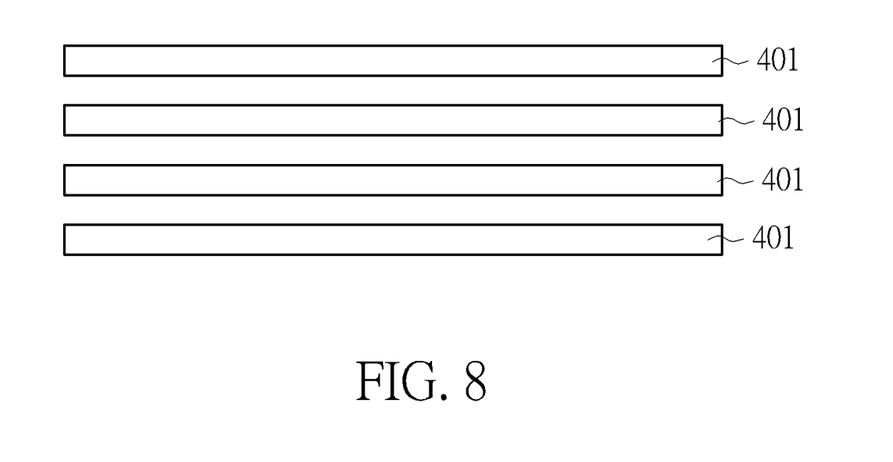
FIG. 8 to FIG. 11 are schematic diagrams illustrating a method of forming a semiconductor device according to a second embodiment of the present invention.
Figure 10:
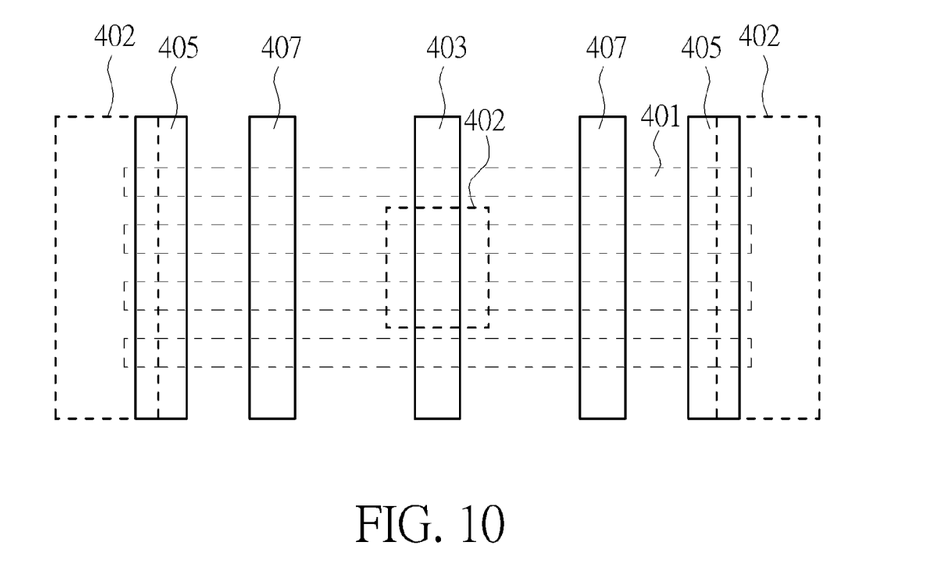
Figure 11:
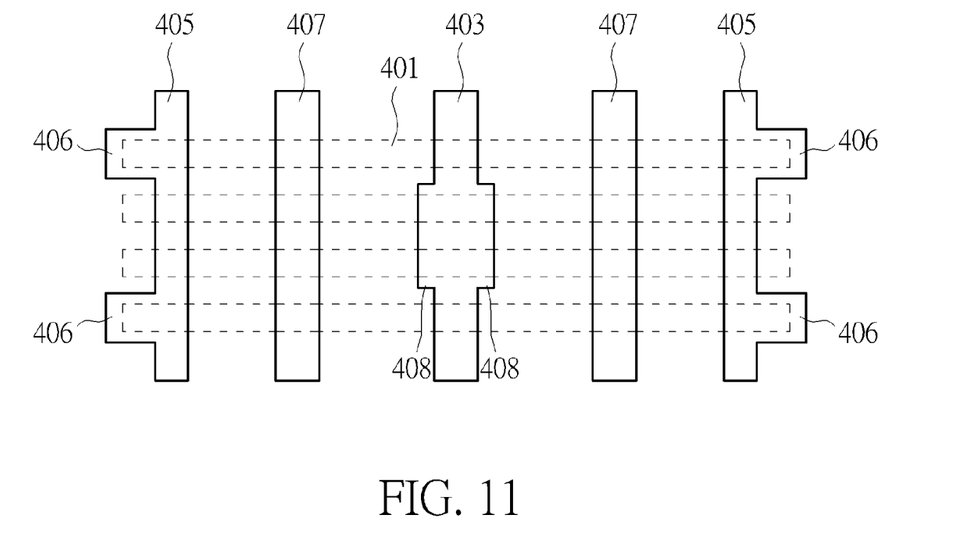

Please refer to FIG. 8 and FIG. 11, which are schematic diagrams illustrating a method of forming a semiconductor device according to the second embodiment of the present invention. The formal steps in the present embodiment are similar to those in the first embodiment, and the differences between the present embodiment and the aforementioned first embodiment are that, the present invention directly uses a graphic data system (GDS) to define mask patterns for forming fin shaped structures and the gate structures. Precisely, the forming method of the present embodiment may include providing a first patterns which includes a plurality of parallelledly arranged fin patterns 401, and inputting the fin patterns 401 into a computer system (not shown in the drawings). The fin patterns 401 refer to desired fin shaped structures formed subsequently on a semiconductor photoresist layer (not shown in the drawings), and which may reflect the desired layout of the subsequently-formed semiconductor device.

Figure 9:
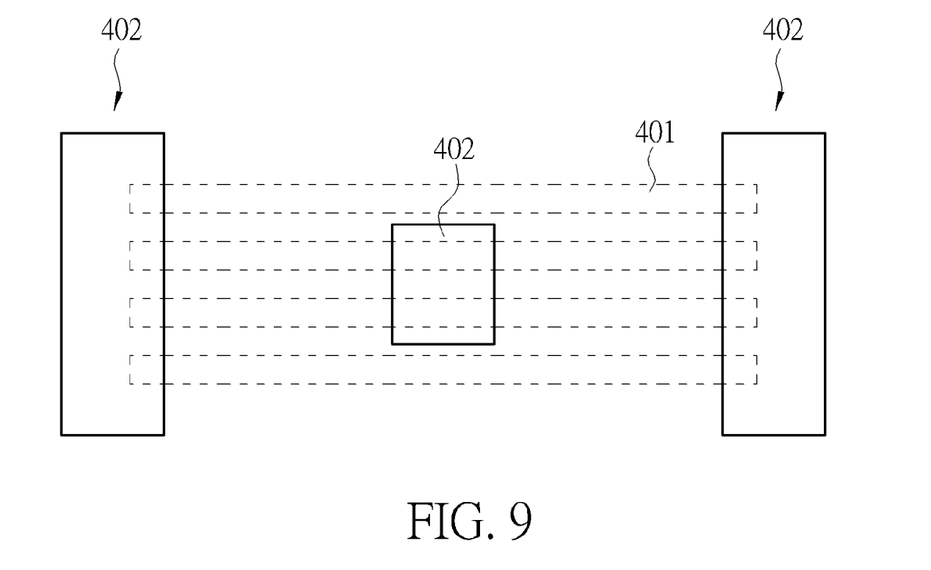

However, for avoiding the optical proximity effects resulting in deformed transferred patterns of the fin patterns 401, a second pattern, including opening patterns 402 as shown in FIG. 9, is further provided and inputted in the computer system in the present embodiment. The opening patterns 402 refer to desired etching openings formed subsequently on a photoresist layer (not shown in the drawings), and which is preferably formed at two sides of the fin patterns 401 and partially overlaps the two sides of the fin patterns 401. Thus, in the following fin cut process, the photoresist layer may be used as an etching mask to remove unnecessary fin shaped structures (not shown in the drawings), thereby forming required layout of the fin shaped structures. However, in the practical process, the transferred etching patterns (namely, the etching openings) formed on the photoresist layer may be different from the actual design opening patterns 402 due to the occur corner rounding effects, such that, the follow-up formed fin shaped structures may have the tipped end 101a shown in aforementioned FIG. 3.

Then, as shown in FIG. 10 and FIG. 11, a third pattern, including a plurality of gate patterns 403, 405 crossing the fin patterns 401, is provided and also inputted into the computer system. The gate patterns 403, 405, 407 are parallel to each other and at least partially overlap with the fin patterns 401. It is worth noting that, in addition to using an optical proximity correction method (OPC method) to modify each pattern and to adjust the overlapping positions of any two patterns, the present embodiment may further perform a determining process, to identify any of the gate patterns 403, 405, 407 which are enabled to cross the fin patterns 401 or to form practical semiconductor layout in the subsequent process. Also, an adjusting process may be performed next, to form an extending pattern 406, 408 shown in FIG. 11 at the gate pattern where it is not crossed by the fin patterns 401, for example, at two sides of the gate pattern 405, 407 which is not crossed by the fin patterns 401 or at an overlapping portion between the gate patterns 405, 407 and the opening patterns 402. In this way, the method of the present embodiment is desired to form gate structures which are enabled to completely or efficiently cover the tipped ends 101a of the fin shaped structures.

Finally, the third pattern including the gate patterns 403, 405, 407 is outputted to form corresponding masks (not shown in the drawing) wherein, the dotted lines shown in FIG. 11 refer to the corresponding opening patterns 402 and the fin shaped structures 101. In the following, the masks may be used in various exposure techniques, for example, photolithography-photolithography-etch (2P1E) steps, or photolithography-etch-photolithography-etch (2P2E) steps, but not limited thereto. For example, a photolithography and an etching process, may be firstly performed on a photoresist layer (not shown in the drawings) by using a first mask having the fin patterns 401 shown in FIG. 8, another photolithography and an etching process, may be next performed on the photoresist layer by using a second mask having the opening pattern 402 as shown in FIG. 9, and the other photolithography and an etching process, may be then performed on the photoresist layer by using a third mask having the gate patterns 403, 405, 407, so that the desired layout of the semiconductor device as shown in FIG. 6 of the aforementioned first embodiment may be obtained, accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
 a plurality of fin shaped structures disposed in a substrate, wherein at least one of the fin shaped structures has a tipped end; and
 a dummy gate structure disposed on the substrate, wherein the dummy gate structure comprises an extending portion covering the tipped end, and the extending portion only extends from a portion of the dummy gate structure and the portion of the dummy gate structure has a width greater than a width of other portions of the dummy gate structure.

2. The semiconductor device of claim 1, wherein the tipped end has a continuously shrunk width.

3. The semiconductor device of claim 1, wherein the tipped end has an inclined edge having an acute angle and an obtuse angle with two parallel edges of the fin shaped structure respectively.

4. The semiconductor device of claim 1, further comprising:
 a plurality of shallow trench isolations disposed in the substrate, surrounding the fin shaped structures.

5. The semiconductor device of claim 4, wherein the dummy gate structure is disposed on the shallow trench isolations.

6. The semiconductor device of claim 4, wherein the dummy gate structure partially covers the shallow trench isolations.

7. The semiconductor device of claim 1, further comprising:
 a spacer disposed on sidewalls of the dummy gate structure.

8. A method of forming a semiconductor device, comprising:
- forming a plurality of shallow trench isolations to surround a plurality of fin shaped structures in a substrate, wherein at least one of the fin shaped structures has a tipped end; and
- forming a dummy gate structure on the substrate, wherein the dummy gate structure comprises an extending portion covering the tipped end, and the extending portion only extends from a portion of the dummy gate structure and the portion of the dummy gate structure has a width greater than a width of other portions of the dummy gate structure.

9. The method of forming a semiconductor device of claim 8, wherein the tipped end has a continuously shrunk width.

10. The method of forming a semiconductor device of claim 8, wherein the tipped end has an inclined edge having an acute angle and an obtuse angle with two parallel edges of the fin shaped structure respectively.

11. The method of forming a semiconductor device of claim 8, wherein the dummy gate structure covers a portion of the shallow trench isolations.

12. The method of forming a semiconductor device of claim 8, wherein the forming of the shallow trench isolations comprises:
- forming a plurality of shallow trenches in the substrate to define the fin shaped structures; and
- forming an insulating layer filled in the shallow trenches to form the shallow trench isolations.

13. The method of forming a semiconductor device of claim 8, further comprising:
- forming a plurality of fin shaped structures in frames in the substrate through a sidewall image transferring process; and
- performing a fin-cut process to form the fin shaped structures.

14. The method of forming a semiconductor device of claim 8, further comprising:
- forming a first mask and a second mask by using a graphic design system; and
- forming the fin shaped structures and the dummy gate structure through the first mask and the second mask respectively.

15. The method of forming a semiconductor device of claim 14, wherein the using of the graphic design system comprises:
- defining a plurality of fin patterns through the graphic design system;
- defining a plurality of gate patterns through the graphic design system; and
- forming the first mask and the second mask through the fin patterns and the gate patterns.

16. The method of forming a semiconductor device of claim 15, wherein the graphic design system process further comprises:
- a determining process, identifying the gate patterns enabled to cross the fin patterns.

17. The method of forming a semiconductor device of claim 16, wherein the graphic design system process further comprises:
- an adjusting process, forming an extending pattern at two sides of the gate pattern which is not crossed by the fin patterns.

* * * * *